United States Patent
Weiss et al.

(10) Patent No.: US 8,836,780 B2
(45) Date of Patent: Sep. 16, 2014

(54) PROCESS CONTROL AND MANUFACTURING METHOD FOR FAN OUT WAFERS

(75) Inventors: Tommy Weiss, Sunnyvale, CA (US); Nevo Laron, Walnut Creek, CA (US); Thomas Molders, Ertvelde (BE); Aki Shoukrun, Petach Tikva (IL); Nadav Wertsman, Ein Hod (IL)

(73) Assignee: Camtek Ltd., Migdal Haemek (IL)

( * ) Notice: Subject to any disclaimer, the term of this patent is extended or adjusted under 35 U.S.C. 154(b) by 854 days.

(21) Appl. No.: 13/047,811

(22) Filed: Mar. 15, 2011

(65) Prior Publication Data

US 2011/0249111 A1 Oct. 13, 2011

Related U.S. Application Data

(60) Provisional application No. 61/315,072, filed on Mar. 18, 2010.

(51) Int. Cl.
*H04N 7/18* (2006.01)
*H01L 21/66* (2006.01)

(52) U.S. Cl.
CPC ............ *H01L 22/20* (2013.01); *H01L 22/12* (2013.01); *H01L 2924/014* (2013.01)
USPC ................................................ 348/87; 348/86

(58) Field of Classification Search
CPC ........ H01L 22/12; H01L 22/20; H01L 22/014
USPC .................... 348/87, 86, 92, 94, 95, 97, 98
See application file for complete search history.

(56) References Cited

U.S. PATENT DOCUMENTS

2013/0280826 A1* 10/2013 Scanlan et al. ................. 438/15

* cited by examiner

*Primary Examiner* — Robert Chevalier
(74) *Attorney, Agent, or Firm* — Oren Reches

(57) ABSTRACT

A system and method for monitoring a manufacturing process of a fan-out wafer, the method may include acquiring a first set of images of dies after a completion of a first manufacturing stage of a manufacturing process of the fan-out wafer; processing the first set of images to detect defects; performing at least one corrective operation in response to at least one defect detected by processing the first set of images; acquiring a second set of images of dies after a completion of a second manufacturing stage of the manufacturing process of the fan-out wafer, the second manufacturing process follows the first manufacturing process; processing the second set of images to detect defects; and performing at least one corrective operation in response to at least one defect detected by processing the second set of images.

22 Claims, 6 Drawing Sheets

PROCESS CONTROL AND MANUFACTURING METHOD FOR FAN OUT WAFERS

RELATED APPLICATIONS

This patent application claims priority of U.S. provisional patent filing date Mar. 18, 2010 Ser. No. 61/315,072 which is incorporated herein by its entirety.

BACKGROUND OF THE INVENTION

Embedded Wafer Level Packaging (eWLP) and Embedded wafer Ball Grade array (eWLB) (also known as "Fan out" processes) are built by the following process:
i. Dicing (sawing) a silicon wafer to individual silicon dice;
ii. Placing each silicon die "face down" (or "Flip Chip") by a pick and place device onto a mold (such as a tape). The tape forms a mold in which a casting will be molded.
iii. Molding a casting material that (optionally—after curing) provides a frame around each silicon die to provide molded dies that form a reconstructed wafer (also known as fan out wafer or a molded wafer), wherein each molded die has a larger area for placing interconnects—that area includes the surface of the silicon die and the frame that surrounds the silicon die;
iv. Applying (patterning) of a redistribution layer (RDL) that includes multiple conductors that are expected to electrically connect pads of the silicon die and interconnects (such as solder bumps) that should be formed on the entire surface of the molded die;
v. Performing a bumping process to complete the manufacturing process and provide interconnects that can be connected to printed circuit boards or to any other element.

Various errors may include: silicon die misalignment (along any axis, including rotation, in relation to the entire wafer, to another die to an expected position), height differences between the silicon die and the frame, misalignments between the silicon die and the frame, conductor misalignment and interconnects misalignment.

Such fan out wafers may exhibit an uncertainty of location, shift and tilt of each individual die thus complicating (and introducing errors) in the manufacturing process—usually patterning of RDL, applying bumps, TSV and the like). This may cause process yield loss or final product quality and reliability issues of the end product during its service.

This yield loss or device quality and reliability may result from major alignment problems related to the interface between the silicon die and the frame and the rest of the dies on the fan-out wafer:
(a) Translation and rotation errors caused during pick, flip and place of each individual silicon die—leading to horizontal (X,Y) misplacement and rotation (Theta) issues between pads on each silicon die (as it located de-facto) and the orientation of the image of RDL, which should be applied on each silicon die and the frame during patterning and other manufacturing processes; and
(b) Surface height difference between the silicon die and the frame, which may lead to the pattern distortion during the RDL patterning process and manufacturing problems during RDL and further steps manufacturing.

Each manufacturing stage assumes that all dice on fan-out wafer are perfectly aligned within single, constant and predictable die index (delta-X and delta-Y) and have zero rotation and Z tilt/roll.

This fault free assumption can result from using manufacturing equipment (especially for patterning, probing, testing and bumping) that were designed for the manufacturing of full, non-diced, wafers. Failing to recognize or adjust the variations of location and other attributes of each individual die results in unrecoverable yield loss.

SUMMARY OF THE INVENTION

A method for monitoring a manufacturing process of a fan-out wafer, the method may include: acquiring a first set of images of dies after a completion of a first manufacturing stage of a manufacturing process of the fan-out wafer; processing the first set of images to detect defects; performing at least one corrective operation in response to at least one defect detected by processing the first set of images; acquiring a second set of images of dies after a completion of a second manufacturing stage of the manufacturing process of the fan-out wafer, the second manufacturing process follows the first manufacturing process; processing the second set of images to detect defects; and performing at least one corrective operation in response to at least one defect detected by processing the second set of images.

The first manufacturing stage may include positioning the silicon dies in a mold, the first set of images may include images of the silicon dies, the processing of the first set of images may include finding misalignments of the silicon dies; and the performing of the at least one corrective operation may include changing a position of at least one silicon die.

The first manufacturing stage may include molding casting material; the first set of images may include images of the silicon dies; the processing of the first set of images may include finding misalignments between a silicon die and a frame that surrounds the silicon die to provide a molded die; and wherein the at least one corrective operation may include removing the frame and molding a new frame.

The first manufacturing stage may include molding casting material; the first set of images may include images of the silicon dies; the processing of the first set of images may include finding misalignments between a silicon die and a frame that surrounds the silicon die to provide a molded die; and wherein the at least one corrective operation may include removing a portion of the frame.

The first manufacturing stage may include molding casting material; the first set of images may include images of the silicon dies; the processing of the first set of images may include finding misalignments between a silicon die and a frame that surrounds the silicon die to provide a molded die; and wherein the at least one corrective operation may include updating a manufacturing entity with the misalignments between the silicon die and the frame.

The second manufacturing stage may include molding casting material; the second set of images may include images of the silicon dies; the processing of the second set of images may include finding misalignments between a silicon die and a frame that surrounds the silicon die to provide a molded die; and wherein the at least one corrective operation may include removing the frame and molding a new frame.

The second manufacturing stage may include molding casting material; the second set of images may include images of the silicon dies; the processing of the second set of images may include finding misalignments between a silicon die and a frame that surrounds the silicon die to provide a molded die; and wherein the at least one corrective operation may include removing a portion of the frame.

The second manufacturing stage may include molding casting material, the second set of images may include images of the silicon dies; the processing of the second set of images may include finding misalignments between a silicon die and a frame that surrounds the silicon die to provide a molded die; and wherein the at least one corrective operation may include updating a manufacturing entity with the misalignments between the silicon die and the frame.

The first manufacturing stage may include applying a redistribution layer; the first set of images may include images of molded dies that comprise the redistribution layer; the processing of the first set of images may include finding redistribution layer conductor defects and the at least one corrective operation may include amending the redistribution layer conductor defects.

The first manufacturing stage may include applying a redistribution layer; the first set of images may include images of molded dies that comprise the redistribution layer; the processing of the first set of images may include finding redistribution layer conductor defects and the at least one corrective operation may include updating a manufacturing entity that applies a manufacturing process that follows the first manufacturing stage with the redistribution layer conductor defects.

The second manufacturing stage may include applying a redistribution layer; the second set of images may include images of molded dies that comprise the redistribution layer; the processing of the second set of images may include finding redistribution layer conductor defects and the at least one corrective operation may include updating a manufacturing entity that applies a manufacturing process with the redistribution layer conductor defects.

The second manufacturing stage may include generating interconnects that are coupled to conductors of a redistribution layer; the second set of images may include images of molded dies that comprise the interconnects; the processing of the second set of images may include finding interconnects defects and the at least one corrective operation may include updating a manufacturing entity that applies a manufacturing process with the interconnects defects.

The second manufacturing stage may include generating interconnects that are coupled to conductors of a redistribution layer; the second set of images may include images of molded dies that comprise the interconnects; the processing of the second set of images may include finding interconnects defects and the at least one corrective operation may include amending at least one of the interconnects defects.

The method may include acquiring a third set of images of dies after a completion of a third manufacturing stage of the manufacturing process of the fan-out wafer, the third manufacturing process differs from the first and second manufacturing processes; processing the third set of images to detect defects; and performing at least one corrective operation in response to at least one defect detected by processing the third set of images.

The third manufacturing stage may include applying a redistribution layer; the third set of images may include images of molded dies that comprise the redistribution layer; the processing of the third set of images may include finding redistribution layer conductor defects and the at least one corrective operation may include updating a manufacturing entity that applies a manufacturing process with the redistribution layer conductor defects.

The third manufacturing stage may include generating interconnects that are coupled to conductors of a redistribution layer; the third set of images may include images of molded dies that comprise the interconnects; the processing of the third set of images may include finding interconnects defects and the at least one corrective operation may include updating a manufacturing entity that applies a manufacturing process with the interconnects defects.

The third manufacturing stage may include generating interconnects that are coupled to conductors of a redistribution layer; the third set of images may include images of molded dies that comprise the interconnects; the processing of the third set of images may include finding interconnects defects and the at least one corrective operation may include amending at least one of the interconnects defects.

The method may also include acquiring a fourth set of images of dies after a completion of a fourth manufacturing stage of the manufacturing process of the fan-out wafer, the fourth manufacturing process differs from the first and second manufacturing processes; processing the fourth set of images to detect defects; and performing at least one corrective operation in response to at least one defect detected by processing the fourth set of images.

The fourth manufacturing stage may include generating interconnects that are coupled to conductors of a redistribution layer; the fourth set of images may include images of molded dies that comprise the interconnects; the processing of the fourth set of images may include finding interconnects defects and the at least one corrective operation may include updating a manufacturing entity that applies a manufacturing process with the interconnects defects.

The fourth manufacturing stage may include generating interconnects that are coupled to conductors of a redistribution layer; the fourth set of images may include images of molded dies that comprise the interconnects; the processing of the fourth set of images may include finding interconnects defects and the at least one corrective operation may include amending at least one of the interconnects defects.

A computer program product the includes a non-transitory computer readable medium that stores instructions for: acquiring a first set of images of dies after a completion of a first manufacturing stage of a manufacturing process of the fan-out wafer; processing the first set of images to detect defects; performing at least one corrective operation in response to at least one defect detected by processing the first set of images; acquiring a second set of images of dies after a completion of a second manufacturing stage of the manufacturing process of the fan-out wafer, the second manufacturing process follows the first manufacturing process; processing the second set of images to detect defects; and performing at least one corrective operation in response to at least one defect detected by processing the second set of images.

An inspection system, comprising: an image sensor for: acquiring a first set of images of dies after a completion of a first manufacturing stage of a manufacturing process of the fan-out wafer; acquiring a second set of images of dies after a completion of a second manufacturing stage of the manufacturing process of the fan-out wafer, the second manufacturing process follows the first manufacturing process; an image processor for: processing the first set of images to detect defects; assisting in a performing of at least one corrective operation in response to at least one defect detected by processing the first set of images; processing the second set of images to detect defects; and assisting in performing at least one corrective operation in response to at least one defect detected by processing the second set of images.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1A:
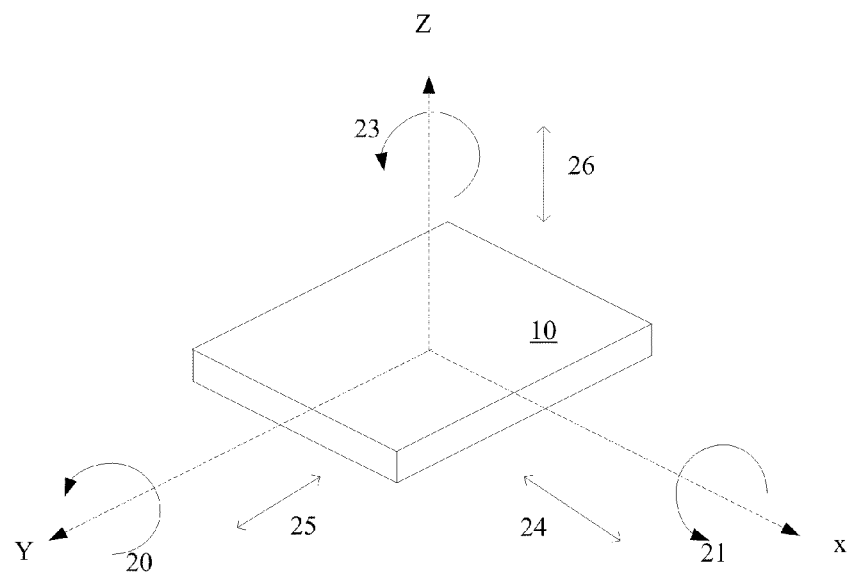
FIGS. 1A-1D illustrate defects.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

A monitoring process and a manufacturing process that is responsive to the outcome of the monitoring process are provided. Multiple iterations of inspection, obtaining die information and optionally performing corrective measures are provided.

The term defects may include any deviation from a desired outcome of the manufacturing process. It may include misalignments, cracks, excess mold material, scratches, foreign particle, misplacement of any element of the molded die, electrical shorts, electrical cuts, mechanical defects, displacement of die from a desired location, and the like. A defect can be detected by using metrology and additionally or alternatively inspection techniques.

FIGS. 1A-1D illustrate defects.

FIG. 1A illustrates possible directions for die misalignments—including displacement 24 along X-axis, rotation 21 about X-axis, displacement 25 along Y-axis, rotation 20 about Y-axis, displacement 26 along Z-axis, rotation 23 about Z-axis, wherein the die 10 is positioned in an X-Y plane.

Figure 1B:
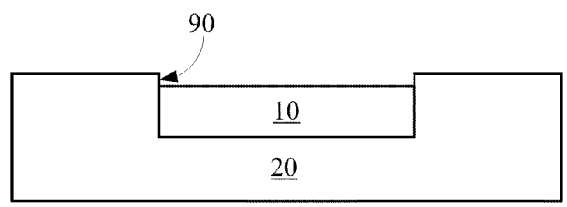

FIG. 1B illustrates a height difference 90 between the frame 20 and the silicon die 10.

Figure 1C:
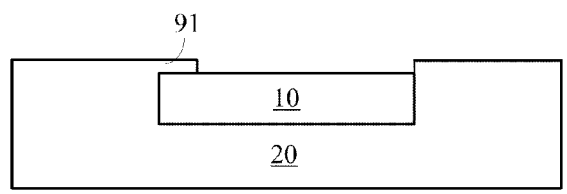

FIG. 1C illustrates excess mold 91—mold material that is positioned on lower surface of the die 10—the surface that should be exposed.

Figure 1D:
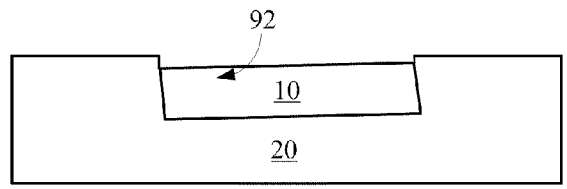

FIG. 1D illustrates a misalignment 92 between the frame 20 and the silicon die 10.

Figure 2A:
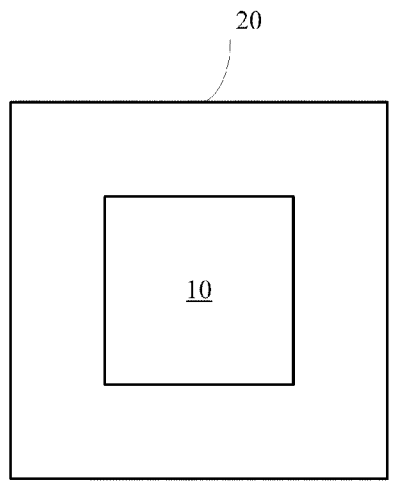
FIGS. 2A-2F illustrate spatial relationships between a silicon die and a frame.
Figure 2B:
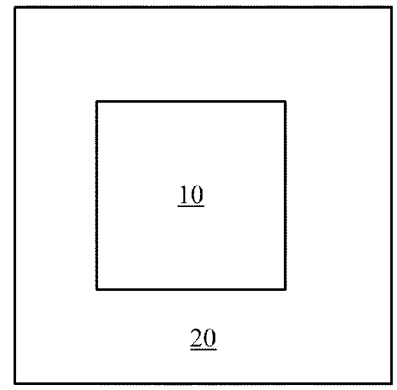
Figure 2C:
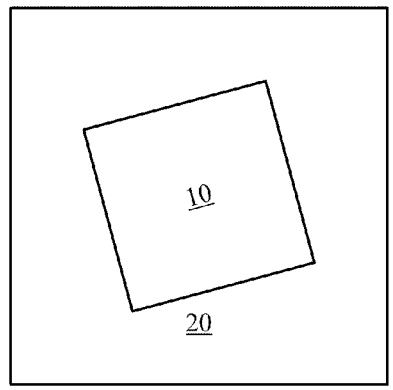
Figure 2D:
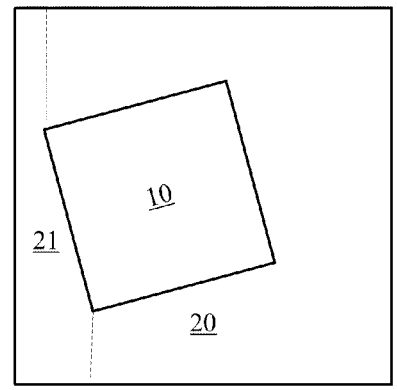
Figure 2E:
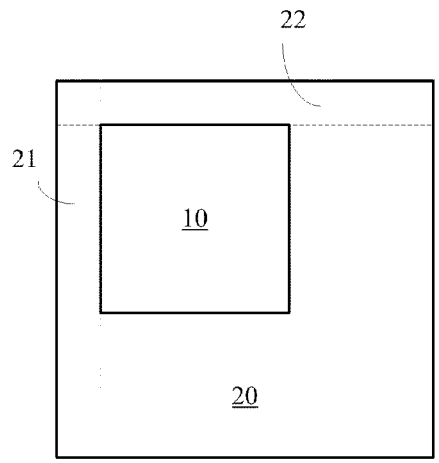
Figure 2F:
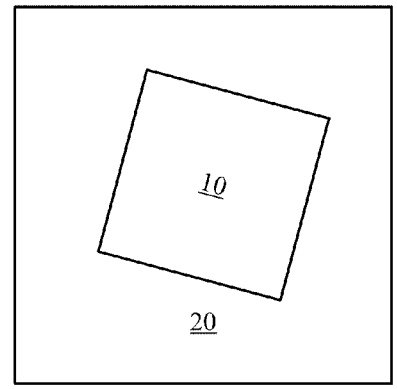

FIGS. 2A-2F illustrate spatial relationships between a silicon die and a frame. The silicone die 10 should be aligned with the frame 20 and positioned at the center of the frame. Typically, some deviations from center and some misalignment are allowed—as illustrated in FIGS. 2B, 2C and 2F.

There are some deviations from center and some misalignment that are not tolerable—especially if they result in malfunction of deviations from a required number of bumps per die. For example—if defining a minimal number of bumps that should be positioned on the frame on each side of the silicon die—then if the misalignment and/or deviation from center prevent the placement of such a desired number of bumps—then a defect is declared.

For example—FIG. 2D illustrates a silicon die 10 that is misaligned and is also located close to the left edge of the frame 20 so that in an area 21 (defined between the left edge of the frame 20 and the silicon die 10) there is not enough room to place a minimal allowable number of bumps. Yet for another example FIG. 2E illustrates a silicon die 10 that is aligned with the frame 20 but is too close to the upper edge and the left edge of the frame 20 so that in each or areas 21 and 22 (are defined between the left edges of the frame 20 and the silicon die 10 and the upper edges of the frame 20 and the silicon die 10 respectively) there is not enough room to place a minimal allowable number of bumps.

The suggested methods and systems may obtain various types of information during the various manufacturing process of a molded wafer. These types of information are referred to as die information. It may include measurements, defect information and the like. Die information may also be referred to as wafer information.

The die information may include an exact location of each die within the wafer including but not limited to X,Y, $\Theta$, a tilt of the die inside the surrounding mold, exact location of RDL and pads for precise bumps positioning, bump height measurement and die bump co-planarity.

The manufacturing process can benefit from such information. The manufacturing process can be performed by any tools including but not limited to a photo-lithography stepper, a scanner, a step and repeat tool, a direct write device such as Laser Direct Imaging or e-beam direct write tools, electrical probers, and bumping The FAB manufactures the wafer as Silicon ONLY, in the preceding steps to the entire eWLB process.

Figure 3:
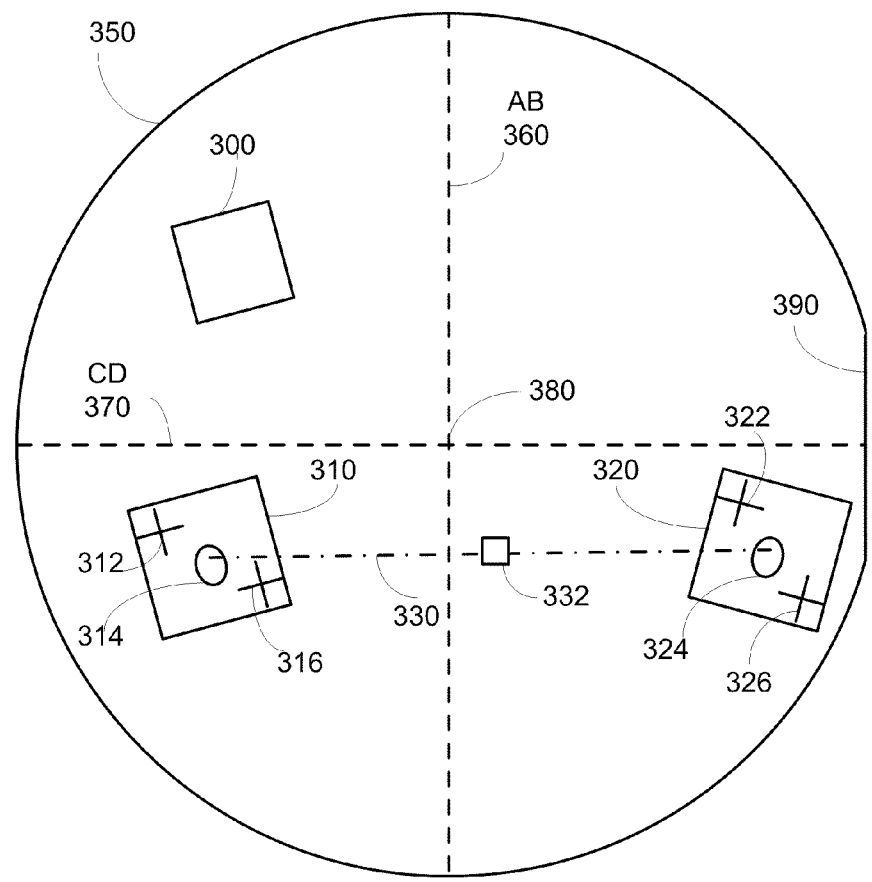
FIG. 3 illustrates spatial relationships between a production die and two test dies.

FIG. 3 illustrates spatial relationships between a production die 300 and two test dies 310 and 320.

A diced wafer 350 includes multiple dies such as die 300 (which is a "regular" die and can also be referred to as production die) and two test dies 310 and 320.

The coordinates of die 300 can be arranged in any suitable format including but not limited to KLARF.

The precise location of each die (X,Y,$\Theta$) can be provided in accordance to the wafer center 380, a fiducial point (or points) on the wafer (not shown), notch (390) location, or any predefined reference and axes AB 360 and CD 370 or alternatively in accordance to the center of the line 330 that connects centers 314 and 324 of test dice 310 and 320, fiducial point (or points) of test dies 312, 316, 322 and 326, reference die, flat/notch or alternatively in accordance to any origin point defined by any format such as KLARF or others.

According to an embodiment of the invention there are at least two inspection iterations. They can be executed, for example, (a) before RDL patterning, and (b) after RDL patterning.

The output of the first inspection step (a) may provide feed forward information regarding each die deviation from its original location in terms of X, Y, Theta and height and angle of incidence related to the mold surface.

A patterning process tool can use this information to ensure pattern alignment with respect to the shifted die by compensating the RDL pattern printing according to the pick and place error. In the eWLP case, it will improve the alignment between the bond pad of the die and the RDL pattern.

After the patterning process, there is one more inspection step (b) in which the quality of the RDL patterning process is evaluated. This may include evaluating the dimensions, alignment and defects on the entire device with special attention to the RDL pattern as well and mainly the alignment between the RDL and bond pad.

This inspection tool can feed back this information to two sources: (a) The patterning process tool—as a tool monitor and as a flag in case corrective action is required; and (b) a process control, defect management system and/or yield management system in order to enable patterning process rework as well as for process control and yield analysis purpose.

Figure 4:
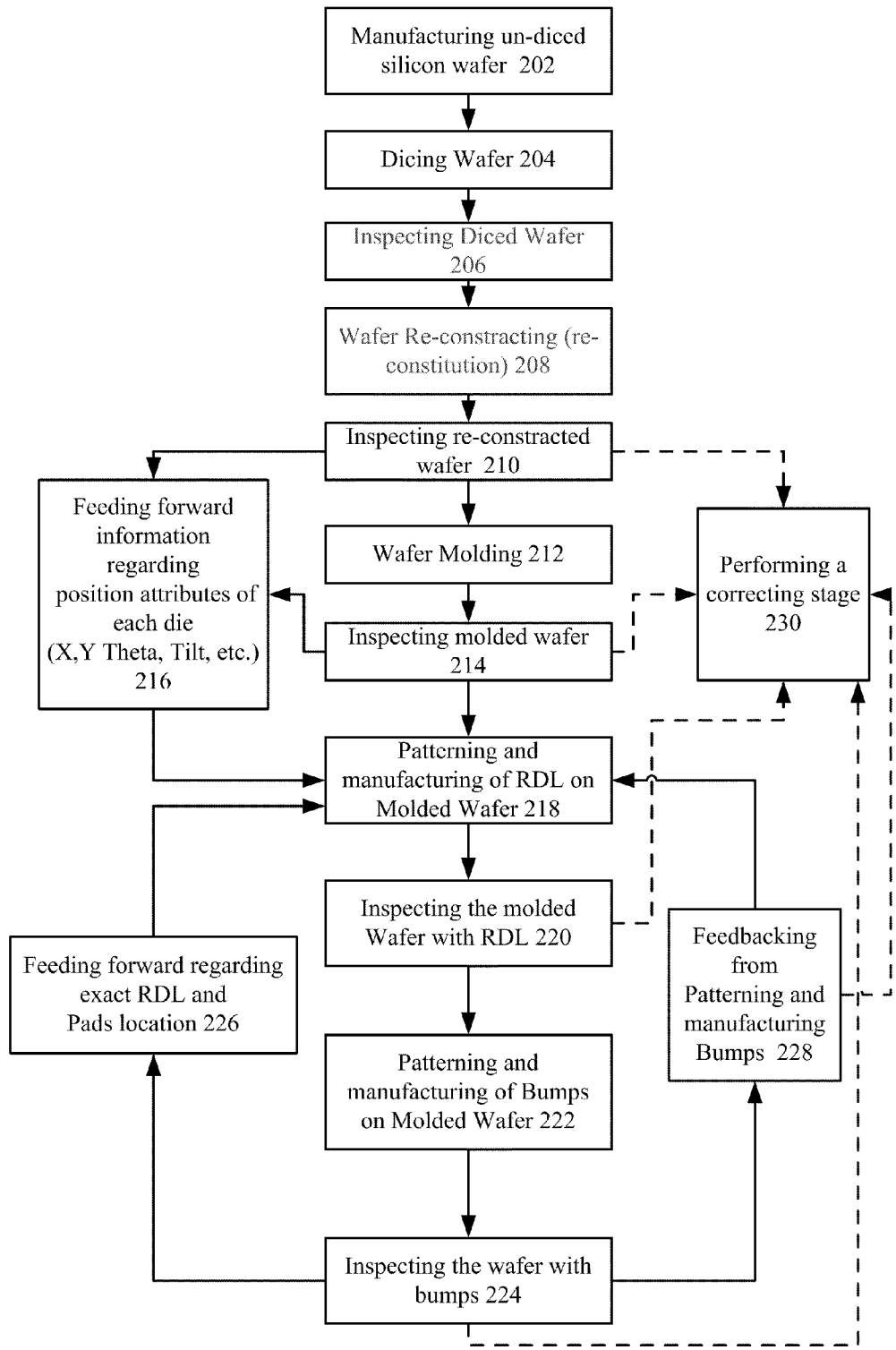
FIG. 4 is a flow chart of a method according to an embodiment of the invention.

FIG. 4 is a flow chart of a method 400 according to an embodiment of the invention. Method 400 includes feed forward and feedback stages.

Method 400 includes a sequence of stages 202, 204, 206, 208, 210, 212, 214, 218, 220, 222 and 224. Method 400 also includes feed forwarding stage 216 (from stage 210 and stage 214 to stage 218), feed forwarding stage 226 (from stage 218 to stage 222) and feed-backing stage 224 (from stage 222 to stage 218). It is noted that the information obtained during any inspection stage (during stage 202, 206, 210, 214, 220 and 224) can be fed to a manufacturing entity. FIG. 4 also illustrates stage 230 of performing a correcting stage 230. It is noted that the corrective can be a yield increasing stage, providing information (thus stage 230 may includes stage 216, 226 and 228), responding to die information provided during feed forwarding and/or feed-backing stages, and the like.

Stage 202 includes manufacturing un-diced silicon wafer. This stage may include inspecting during the manufacturing process, obtaining die information, correcting defects, disqualifying dies, and the like.

Stage 204 includes dicing the wafer.

Stage 206 includes inspecting the diced wafer and obtaining die information.

Stage 208 includes wafer re-constructing (re-constitution).

Step 206 is done on the frame where the wafer was diced, and the pitch/index between die is small. The reconstructed wafer is provided after the dies are placed on a new frame at a much higher index—more spaced apart from each other—, to allow the redistribution process.

Stage 210 includes inspecting the re-constructed wafer and obtaining die information.

Stage 212 includes wafer molding.

Stage 214 includes inspecting the molded wafer and obtaining die information.

Stage 216 includes feeding forward information regarding position attributes of each die (X,Y Theta, Tilt, etc.).

Stage 218 includes patterning and manufacturing of RDL on molded wafer.

Stage 220 includes inspecting the molded wafer with RDL and obtaining die information.

Stage 222 includes patterning and manufacturing of bumps on the molded wafer.

Stage 224 includes feed-backing from patterning and manufacturing bumps

Stage 226 includes feed-forwarding regarding exact RDL and pads location.

Figure 5:
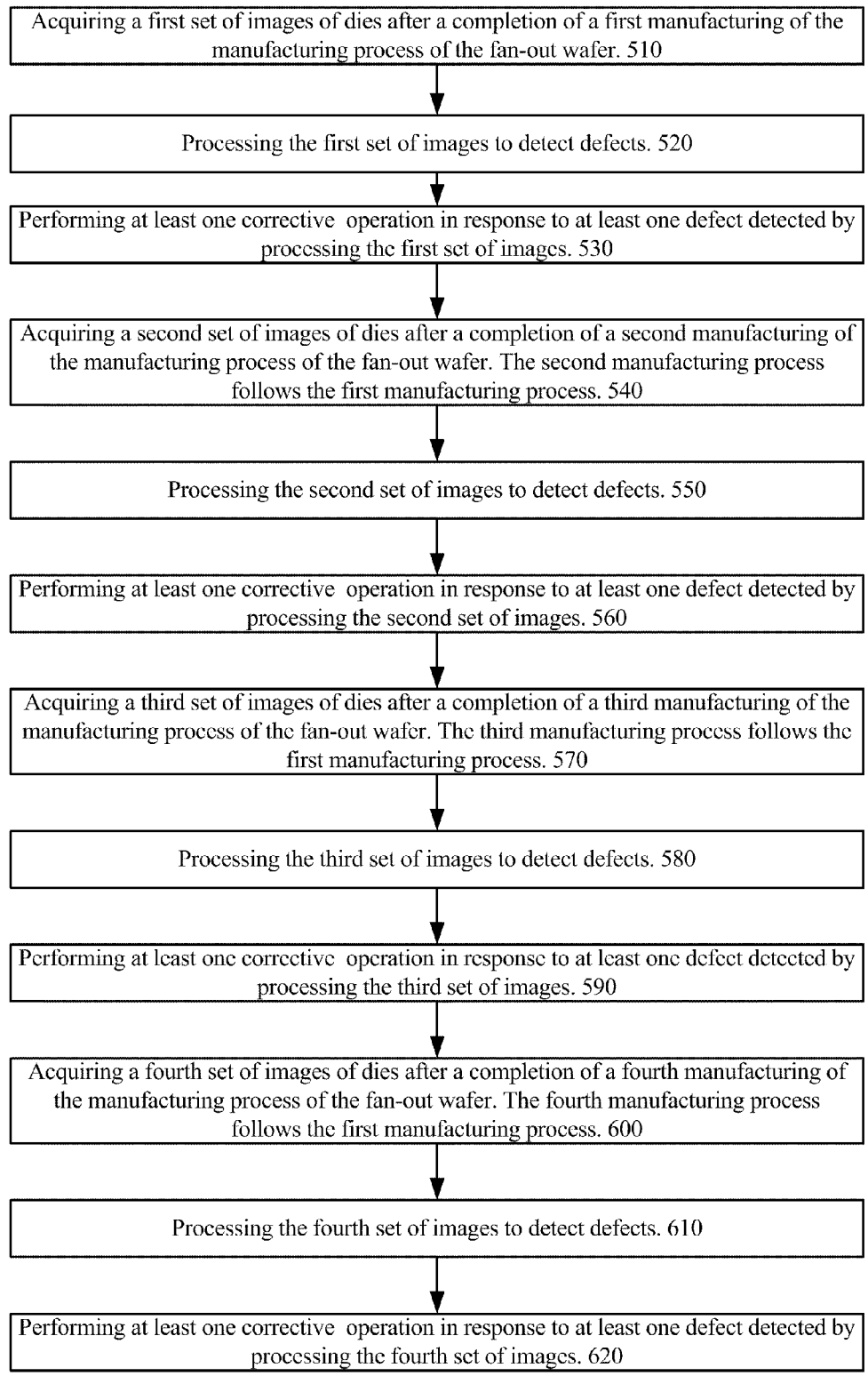
FIG. 5 is a flow chart of a method according to an embodiment of the invention.

FIG. 5 illustrates method 500 for monitoring a manufacturing process of a fan-out wafer according to various embodiments of the invention.

Method 500 starts by stage 510 of acquiring a first set of images of dies after a completion of a first manufacturing stage of the manufacturing process of the fan-out wafer.

Stage 510 is followed by stage 520 of processing the first set of images to detect defects.

Stage 520 is followed by stage 530 of performing at least one corrective operation in response to at least one defect detected by processing the first set of images.

Stage 530 is followed by stage 540 of acquiring a second set of images of dies after a completion of a second manufacturing stage of the manufacturing process of the fan-out wafer. The second manufacturing process follows the first manufacturing process.

Stage 540 is followed by stage 550 of processing the second set of images to detect defects.

Stage 550 is followed by stage 560 of performing at least one corrective operation in response to at least one defect detected by processing the second set of images.

Stage 560 is followed by stage 570 of acquiring a third set of images of dies after a completion of a third manufacturing stage of the manufacturing process of the fan-out wafer. The third manufacturing process follows the first manufacturing process.

Stage 570 is followed by stage 580 of processing the third set of images to detect defects.

Stage 580 is followed by stage 590 of performing at least one corrective operation in response to at least one defect detected by processing the third set of images.

Stage 590 is followed by stage 600 of acquiring a fourth set of images of dies after a completion of a fourth manufacturing stage of the manufacturing process of the fan-out wafer. The fourth manufacturing process follows the first manufacturing process.

Stage 600 is followed by stage 610 of processing the fourth set of images to detect defects.

Stage 610 is followed by stage 620 of performing at least one corrective operation in response to at least one defect detected by processing the fourth set of images.

FIG. 5 illustrates four iterations of (a) acquiring a set of images after a completion of a manufacturing stage, (b) processing the set of images to detect defects; and (c) performing at least one corrective operation in response to at least one defect detected by processing the set of images.

It is noted that the method can include at least two iterations, and not necessarily four iterations. The different iterations can be executed after the following manufacturing stages: (i) positioning the silicon dies in a mold; (ii) molding casting material; (iii) applying a redistribution layer; (iv) generating interconnects, or any other manufacturing stage. It is noted that different iterations can be applied after consecutive manufacturing stage or after non-consecutive manufacturing stages. According to an embodiment of the invention an iteration can be executed after the wafer is diced but before the provision of a reconstructed wafer—before stage (i). This will be referred to as stage (0).

The first manufacturing stage can be, for example, either one of stages (0)-(iii) and thus the first iteration can be executed after either one of stages (0), (i), (ii) and (iii) is completed. The second manufacturing stage follows the first manufacturing stage and can be, for example, either one of stages (ii)-(iv) and thus the second iteration can be executed after either one of stage (i), (ii), (iii) and (iv) is completed.

The third manufacturing stage follows the second manufacturing stage and can be, for example, either one of stages (i)-(iv) and thus the third iteration can be executed after either one of stages (ii), (iii) and (iv) is completed.

The fourth manufacturing stage follows the first till third manufacturing staged, and can be stage (iii) or (iv). The fourth iteration can be executed after stage (iii) or stage (iv) are completed.

The at least one corrective operation can include repairing a defect, replacing a defected die by another, repeating a manufacturing stage in relation to one of more dies of the wafer, updating a manufacturing entity about defects, tuning or otherwise adjusting a manufacturing stage such as to compensate or at least partially solve a problem that reduced a yield and stopping a manufacturing of a die that is so defective that should not or be repaired.

Once one or more defects are detected they can be reported to a manufacturing entity responsible of the manufacturing stage that was just completed, to a manufacturing entity responsible of the manufacturing stage that was completed before the last manufacturing stage, to a manufacturing entity responsible of the manufacturing stage that was not started, or to a combination of two or more such manufacturing entities.

The following table provides an example of different manufacturing stages, different images acquired and different corrective operations.

stage of a manufacturing process of the fan-out wafer; processing the first set of images to detect defects; performing at least one corrective operation in response to at least one defect detected by processing the first set of images; acquiring a second set of images of dies after a completion of a second manufacturing stage of the manufacturing process of the fan-out wafer, the second manufacturing process follows the first manufacturing process; processing the second set of images to detect defects; and performing at least one corrective operation in response to at least one defect detected by processing the second set of images.

Figure 6:
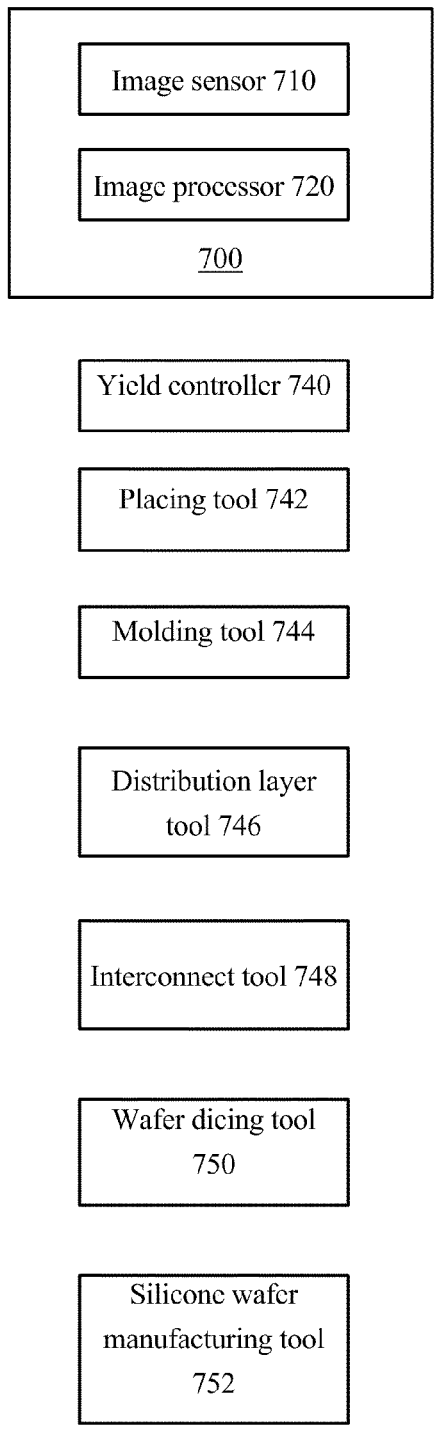
FIG. 6 illustrates a system and its environment according to an embodiment of the invention.

FIG. 6 illustrates an inspection system 700 and its environment according to an embodiment of the invention.

The inspection system 700 includes an image sensor 710 for acquiring a first set of images of dies after a completion of a first manufacturing stage of a manufacturing process of the

TABLE 1

| Manufacturing stage | images | defects | operation |
|---|---|---|---|
| positioning the silicon dies in a mold | Silicon dies | Misalignment | Changing a position of at least one silicon die. Updating a manufacturing entity |
| Molding casting material | Silicon die and frame | Smaller than acceptable area between silicon die and frame boarders | Removing the frame and molding a new frame Updating a manufacturing entity |
| Molding casting material | Silicon die and frame | Excess molding material- May partially cover the bottom portion of the die | Removing a portion of the frame. Removing the frame and molding a new frame Updating a manufacturing entity |
| Molding casting material | Silicon die and frame | Misalignment between frame and silicon die | Removing a portion of the frame. Removing the frame and molding a new frame Updating a manufacturing entity |
| Applying a redistribution layer | Die with redistribution layer | Redistribution layer electrical defects (shorts, cuts) | Disqualifying the molded die if redistribution layer electrical defects are un-tolerable. Fixing redistribution layer electrical defects. Ignoring redistribution layer electrical defects Updating a manufacturing entity |
| Connecting interconnects (such as bumps) | Die with interconnects | Interconnects defects | Disqualifying the die if interconnects are misplaced (above a tolerable level) Fixing interconnects. Ignoring tolerable interconnects errors Updating a manufacturing entity |

According to yet another embodiment of the invention the manufacturing process can precede these mentioned above manufacturing process- and can include manufacturing the silicon wafer and even sawing the silicon wafer. Thus, dies that are defective can be rejected or be repaired.

The reporting of errors and additionally or alternatively of the amendments of such errors can include feed forward and feed back of information. The detection of detects can include measurement of features and such can be regarded as metrology. Feedback includes providing the die information to a manufacturing entity that participates in a manufacturing stage that was completed while feed forward includes providing the die information to a manufacturing entity that participates in a manufacturing stage that was not initiated.

Any of the methods mentioned above or any combination of any stages of the methods illustrated above can be executed by a computer that executes instructions stored in a non-transitory computer readable medium of a computer program product.

For example, the non-transitory computer readable medium can store instructions for: acquiring a first set of images of dies after a completion of a first manufacturing fan-out wafer and for acquiring a second set of images of dies after a completion of a second manufacturing stage of the manufacturing process of the fan-out wafer, the second manufacturing process follows the first manufacturing process. The image sensor 710 can acquire any of the images mention in the specification including the third and fourth sets of images.

The inspection system 700 also includes an image processor 720 for processing the first set of images to detect defects; assisting in a performing of at least one corrective operation in response to at least one defect detected by processing the first set of images; processing the second set of images to detect defects; and assisting in performing at least one corrective operation in response to at least one defect detected by processing the second set of images. The image processor 720 can process any of the images mention in the specification including the third and fourth sets of images. The assisting may include detecting defects, generating die information, providing die information to manufacturing entities, providing an alert to a user, triggering a correcting measure, and the like.

FIG. 6 also illustrates manufacturing entities such as yield controller 740, placing tool 742, molding tool 744, and distribution layer tool 746, interconnect tool 748, wafer dicing tool 750, wafer manufacturing tool 752, or any other entity that can assist in manufacturing the dies.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

The invention claimed is:

1. A method for monitoring a manufacturing process of a fan-out wafer, the method comprises:
   acquiring a first set of images of dies after a completion of a first manufacturing stage of a manufacturing process of the fan-out wafer;
   processing the first set of images to detect defects;
   performing at least one corrective operation in response to at least one defect detected by processing the first set of images;
   acquiring a second set of images of dies after a completion of a second manufacturing stage of the manufacturing process of the fan-out wafer, the second manufacturing process follows the first manufacturing process;
   processing the second set of images to detect defects; and
   performing at least one corrective operation in response to at least one defect detected by processing the second set of images.

2. The method according to claim 1, wherein the first manufacturing stage comprises positioning the silicon dies in a mold, the first set of images comprises images of the silicon dies, the processing of the first set of images comprises finding misalignments of the silicon dies; and the performing of the at least one corrective operation comprises changing a position of at least one silicon die.

3. The method according to claim 1, wherein the first manufacturing stage comprises molding casting material; the first set of images comprises images of the silicon dies; the processing of the first set of images comprises finding misalignments between a silicon die and a frame that surrounds the silicon die to provide a molded die; and wherein the at least one corrective operation comprises removing the frame and molding a new frame.

4. The method according to claim 1, wherein the first manufacturing stage comprises molding casting material; the first set of images comprises images of the silicon dies; the processing of the first set of images comprises finding misalignments between a silicon die and a frame that surrounds the silicon die to provide a molded die; and wherein the at least one corrective operation comprises removing a portion of the frame.

5. The method according to claim 1, wherein the first manufacturing stage comprises molding casting material; the first set of images comprises images of the silicon dies; the processing of the first set of images comprises finding misalignments between a silicon die and a frame that surrounds the silicon die to provide a molded die; and wherein the at least one corrective operation comprises updating a manufacturing entity with the misalignments between the silicon die and the frame.

6. The method according to claim 1, wherein the second manufacturing stage comprises molding casting material; the second set of images comprises images of the silicon dies; the processing of the second set of images comprises finding misalignments between a silicon die and a frame that surrounds the silicon die to provide a molded die; and wherein the at least one corrective operation comprises removing the frame and molding a new frame.

7. The method according to claim 1, wherein the second manufacturing stage comprises molding casting material; the second set of images comprises images of the silicon dies; the processing of the second set of images comprises finding misalignments between a silicon die and a frame that surrounds the silicon die to provide a molded die; and wherein the at least one corrective operation comprises removing a portion of the frame.

8. The method according to claim 1, wherein the second manufacturing stage comprises molding casting material, the second set of images comprises images of the silicon dies; the processing of the second set of images comprises finding misalignments between a silicon die and a frame that surrounds the silicon die to provide a molded die; and wherein the at least one corrective operation comprises updating a manufacturing entity with the misalignments between the silicon die and the frame.

9. The method according to claim 1, wherein the first manufacturing stage comprises applying a redistribution layer; the first set of images comprises images of molded dies that comprise the redistribution layer; the processing of the first set of images comprises finding redistribution layer conductor defects and the at least one corrective operation comprises amending the redistribution layer conductor defects.

10. The method according to claim 1, wherein the first manufacturing stage comprises applying a redistribution layer; the first set of images comprises images of molded dies that comprise the redistribution layer; the processing of the first set of images comprises finding redistribution layer conductor defects and the at least one corrective operation comprises updating a manufacturing entity that applies a manufacturing process that follows the first manufacturing stage with the redistribution layer conductor defects.

11. The method according to claim 1, wherein the second manufacturing stage comprises applying a redistribution layer; the second set of images comprises images of molded dies that comprise the redistribution layer; the processing of the second set of images comprises finding redistribution layer conductor defects and the at least one corrective operation comprises updating a manufacturing entity that applies a manufacturing process with the redistribution layer conductor defects.

12. The method according to claim 1, wherein the second manufacturing stage comprises generating interconnects that are coupled to conductors of a redistribution layer; the second set of images comprises images of molded dies that comprise the interconnects; the processing of the second set of images comprises finding interconnects defects and the at least one corrective operation comprises updating a manufacturing entity that applies a manufacturing process with the interconnects defects.

13. The method according to claim 1, wherein the second manufacturing stage comprises generating interconnects that are coupled to conductors of a redistribution layer; the second set of images comprises images of molded dies that comprise the interconnects; the processing of the second set of images comprises finding interconnects defects and the at least one corrective operation comprises amending at least one of the interconnects defects.

14. The method according to claim 1, further comprising:
   acquiring a third set of images of dies after a completion of a third manufacturing stage of the manufacturing process of the fan-out wafer, the third manufacturing process differs from the first and second manufacturing processes;
   processing the third set of images to detect defects; and performing at least one corrective operation in response to at least one defect detected by processing the third set of images.

15. The method according to claim 14 wherein the third manufacturing stage comprises applying a redistribution layer; the third set of images comprises images of molded dies that comprise the redistribution layer; the processing of the third set of images comprises finding redistribution layer conductor defects and the at least one corrective operation comprises updating a manufacturing entity that applies a manufacturing process with the redistribution layer conductor defects.

16. The method according to claim 14, wherein the third manufacturing stage comprises generating interconnects that are coupled to conductors of a redistribution layer; the third set of images comprises images of molded dies that comprise the interconnects; the processing of the third set of images comprises finding interconnects defects and the at least one corrective operation comprises updating a manufacturing entity that applies a manufacturing process with the interconnects defects.

17. The method according to claim 14, wherein the third manufacturing stage comprises generating interconnects that are coupled to conductors of a redistribution layer; the third set of images comprises images of molded dies that comprise the interconnects; the processing of the third set of images comprises finding interconnects defects and the at least one corrective operation comprises amending at least one of the interconnects defects.

18. The method according to claim 14, further comprising:
acquiring a fourth set of images of dies after a completion of a fourth manufacturing stage of the manufacturing process of the fan-out wafer, the fourth manufacturing process differs from the first and second manufacturing processes;
processing the fourth set of images to detect defects; and
performing at least one corrective operation in response to at least one defect detected by processing the fourth set of images.

19. The method according to claim 18, wherein the fourth manufacturing stage comprises generating interconnects that are coupled to conductors of a redistribution layer; the fourth set of images comprises images of molded dies that comprise the interconnects; the processing of the fourth set of images comprises finding interconnects defects and the at least one corrective operation comprises updating a manufacturing entity that applies a manufacturing process with the interconnects defects.

20. The method according to claim 18, wherein the fourth manufacturing stage comprises generating interconnects that are coupled to conductors of a redistribution layer; the fourth set of images comprises images of molded dies that comprise the interconnects; the processing of the fourth set of images comprises finding interconnects defects and the at least one corrective operation comprises amending at least one of the interconnects defects.

21. A computer program product the includes a non-transitory computer readable medium that stores instructions for:
acquiring a first set of images of dies after a completion of a first manufacturing stage of a manufacturing process of the fan-out wafer;
processing the first set of images to detect defects;
performing at least one corrective operation in response to at least one defect detected by processing the first set of images;
acquiring a second set of images of dies after a completion of a second manufacturing stage of the manufacturing process of the fan-out wafer, the second manufacturing process follows the first manufacturing process;
processing the second set of images to detect defects; and
performing at least one corrective operation in response to at least one defect detected by processing the second set of images.

22. An inspection system, comprising:
an image sensor for:
acquiring a first set of images of dies after a completion of a first manufacturing stage of a manufacturing process of the fan-out wafer;
acquiring a second set of images of dies after a completion of a second manufacturing stage of the manufacturing process of the fan-out wafer, the second manufacturing process follows the first manufacturing process;
an image processor for:
processing the first set of images to detect defects;
assisting in a performing of at least one corrective operation in response to at least one defect detected by processing the first set of images;
processing the second set of images to detect defects; and
assisting in performing at least one corrective operation in response to at least one defect detected by processing the second set of images.

\* \* \* \* \*